United States Patent
Sugawa et al.

(10) Patent No.: US 12,103,089 B2
(45) Date of Patent: Oct. 1, 2024

(54) COATED TOOL

(71) Applicant: KYOCERA CORPORATION, Kyoto (JP)

(72) Inventors: Yuusaku Sugawa, Chikushino (JP); Hayato Kubo, Satsumasendai (JP); Kenji Kumai, Satsumasendai (JP); Hiroyuki Kinjo, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 99 days.

(21) Appl. No.: 17/914,741

(22) PCT Filed: Mar. 24, 2021

(86) PCT No.: PCT/JP2021/012104
§ 371 (c)(1),
(2) Date: Sep. 26, 2022

(87) PCT Pub. No.: WO2021/193676
PCT Pub. Date: Sep. 30, 2021

(65) Prior Publication Data
US 2023/0126815 A1 Apr. 27, 2023

(30) Foreign Application Priority Data
Mar. 27, 2020 (JP) .................. 2020-057684

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 16/36* (2013.01);
(Continued)

(58) Field of Classification Search
None
See application file for complete search history.

(56) References Cited

U.S. PATENT DOCUMENTS 5,071,693 A * 12/1991 Sue ................... C23C 28/048
427/248.1
2006/0019117 A1* 1/2006 Cedergren ............. C23C 16/00
428/701
(Continued)

FOREIGN PATENT DOCUMENTS

JP 200978309 A 4/2009
JP 2009255234 A 11/2009
(Continued)

*Primary Examiner* — Seth Dumbris
(74) *Attorney, Agent, or Firm* — HAUPTMAN HAM, LLP (57) ABSTRACT

A coated tool includes a base and a coating layer on the base. The coating layer includes a first layer including $Al_2O_3$ particles, and a second layer on the first layer. The second layer includes, sequentially from the base, a first film, a second film in contact with the first film, and a third film in contact with the second film. The first to third films individually include Ti. The first film, the second film and the third film individually include at least one kind selected from C and N. The coated tool satisfies a relationship of a first N content>a third N content>a second N content, in which the first N content is an N content in the first film, the second N content is an N content in the second film, and the third N content is an N content in the third film.

4 Claims, 4 Drawing Sheets

(51) Int. Cl.
   *C23C 16/36* (2006.01)
   *C23C 16/40* (2006.01)
   *C23C 28/04* (2006.01)

(52) U.S. Cl.
   CPC .......... *C23C 16/403* (2013.01); *C23C 28/042* (2013.01); *C23C 28/044* (2013.01); *B23B 2224/04* (2013.01); *B23B 2224/32* (2013.01); *B23B 2228/10* (2013.01)

(56) References Cited

U.S. PATENT DOCUMENTS

2017/0009352 A1* 1/2017 Kubo .................... C23C 28/044
2019/0232380 A1    8/2019 Kanaoka et al.
2019/0344356 A1* 11/2019 Kodama ............. C23C 16/0254

FOREIGN PATENT DOCUMENTS

JP        2017221992 A    12/2017
WO    WO-2018092791 A1 *  5/2018 ............. B23B 27/14

\* cited by examiner

COATED TOOL

CROSS-REFERENCE TO RELATED APPLICATION

The present application is a National Phase of International Application No. PCT/JP2021/012104 filed Mar. 24, 2021, which claims priority to Japanese Patent Application No. 2020-057684, filed Mar. 27, 2020. The contents of this Japanese application are incorporated herein by reference in their entirety.

TECHNICAL FIELD

The present disclosure relates to a coated tool.

BACKGROUND

For example, a surface-coated cutting tool discussed in Japanese Unexamined Patent Publication No. 2017-221992 (Patent Document 1) has been known as a coated tool. A coating film including an inner layer and an outer layer is disposed on a base in the surface-coated cutting tool discussed in Patent Document 1. The inner layer includes an aluminum oxide layer as a layer in contact with the outer layer. The outer layer includes a multilayer structure with three or more layers laminated one upon another, and individual layers constituting the multilayer structure include titanium.

SUMMARY

A coated tool in a non-limiting embodiment of the present disclosure includes a base and a coating layer located on the base. The coated tool includes a first surface, a second surface adjacent to the first surface, and a cutting edge located on at least a part of a ridge part of the first surface and the second surface. The coating layer includes a first coating layer which includes a first layer including $Al_2O_3$ particles, and a second layer located on the first layer. The second layer includes, sequentially from a side of the base, a first film, a second film in contact with the first film, and a third film in contact with the second film. The first film, the second film and the third film individually include Ti. The first film, the second film and the third film individually include at least one kind selected from C and N. The coated tool satisfies a relationship of a first N content>a third N content>a second N content, in which the first N content is an N content in the first film, the second N content is an N content in the second film, and the third N content is an N content in the third film.

EMBODIMENT

<Coated Tools>

Coated tools 1 in non-limiting embodiments of the present disclosure are described in detail below with reference to the drawings. For the convenience of description, the drawings referred to in the following illustrate, in simplified form, only main members necessary for describing the embodiments. The coated tools 1 may therefore include any arbitrary structural member not illustrated in the drawings referred to. Dimensions of the members in each of the drawings faithfully represent neither dimensions of actual structural members nor dimensional ratios of these members.

FIGS. 1 to 4 illustrate, as an embodiment of the coated tools 1, a cutting insert applicable to a cutting tool used for a cutting process of a workpiece. The coated tool 1 is applicable to, besides cutting tools, wear resistant parts such as sliding parts and metal molds, digging tools, tools such as blades, and impact resistant parts. Applications of the coated tools 1 are not limited to those exemplified above.

The coated tool 1 may include a base 2 and a coating layer 3 located on the base 2.

Examples of material of the base 2 may include hard alloys, ceramics and metals. Examples of the hard alloys may include cemented carbides in which a hard phase composed of WC (tungsten carbide) and, if desired, at least one kind selected from the group consisting of carbide, nitride and carbonitride of group 4, group 5 and group 6 metals in the periodic table other than WC is bonded by a binding phase composed of an iron group metal such as Co (cobalt) or Ni (nickel). Other hard alloys may be Ti-based cermets. The ceramics may be, for example, $Si_3N_4$ (silicon nitride), $Al_2O_3$ (aluminum oxide), diamond and cBN (cubic boron nitride). The metals may be, for example, carbon steel, high-speed steel and alloy steel. The material of the base 2 is however not limited to those exemplified above.

The coating layer 3 may cover a whole or a part of a surface 4 of the base 2. If the coating layer 3 covers only the part of the surface 4 of the base 2, it may be said that the coating layer 3 is located on at least the part of the base 2.

The coating layer 3 may be deposited by chemical vapor deposition (CVD) method. In other words, the coating layer 3 may be a CVD film.

The coating layer 3 is not limited to a specific thickness. A thickness of the coating layer 3 may be set to, for example, 1-30 μm. The thickness and structure of the coating layer 3, and shapes of crystals constituting the coating layer 3 may be measured by, for example, cross-section observation with an electron microscope. Examples of the electron microscope may include Scanning Electron Microscope (SEM) and Transmission Electron Microscope (TEM).

Figure 1:
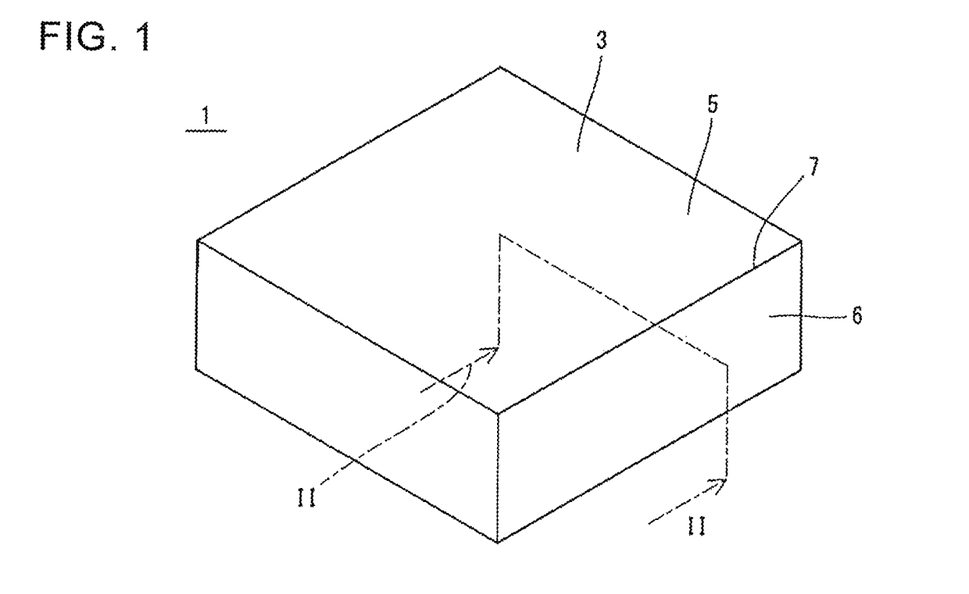
FIG. 1 is a perspective view illustrating a coated tool in a non-limiting embodiment of the present disclosure.
Figure 2:
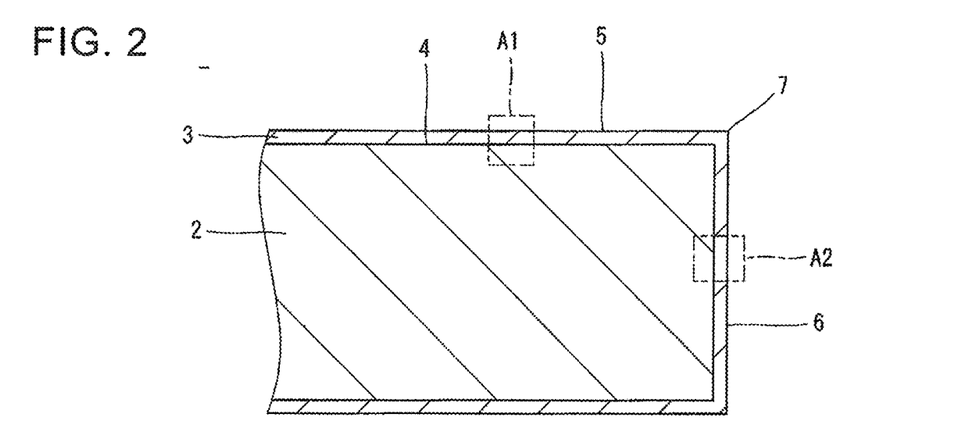
FIG. 2 is a sectional view of a cross section taken along the line II-II in the coated tool illustrated in FIG. 1.

The coated tool 1 may include a first surface 5 (upper surface), a second surface 6 (lateral surface) adjacent to the first surface 5, and a cutting edge 7 located on at least apart of a ridge part between the first surface 5 and the second surface 6 as in a non-limiting embodiment illustrated in FIGS. 1 and 2.

The first surface 5 may be a rake surface. A whole or a part of the first surface 5 may be the rake surface. For example, a region extending along the cutting edge 7 in the first surface 5 may be the rake surface.

The second surface 6 may be a flank surface. A whole or a part of the second surface 6 may be the flank surface. For example, a region extending along the cutting edge 7 in the second surface 6 may be the flank surface.

The cutting edge 7 may be located on a part or a whole of the ridge part. The cutting edge 7 is usable for cutting out a workpiece.

The coated tool 1 may have a quadrangular plate shape as in the non-limiting embodiment illustrated in FIG. 1. The shape of the coated tool 1 is not limited to the quadrangular plate shape. For example, the first surface 5 may have a triangular shape, a pentagonal shape, a hexagonal shape, or a circular shape. The coated tool 1 may have a columnar shape.

The coated tool 1 is not limited to a specific size. For example, a length of one side of the first surface 5 may be set to approximately 3-20 mm. A height from the first surface 5 to a surface (lower surface) located on a side opposite to the first surface 5 may be set to approximately 5-20 mm.

Figure 3:
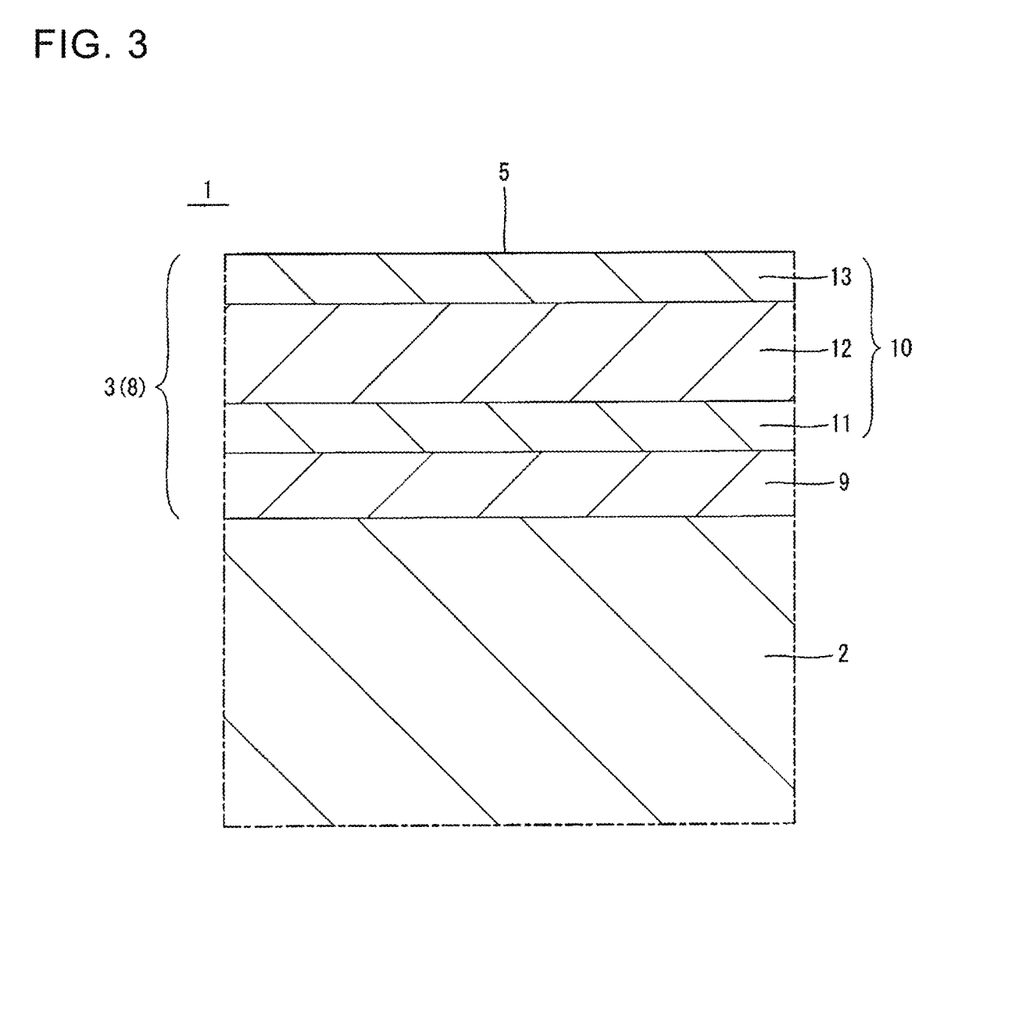
FIG. 3 is an enlarged view of a region A1 illustrated in FIG. 2.

The coating layer 3 may include a first coating layer 8 as in a non-limiting embodiment illustrated in FIG. 3. The first coating layer 8 may include a first layer 9 and a second layer 10 located on the first layer 9.

The first layer 9 may include $Al_2O_3$ particles. The first layer 9 may be an $Al_2O_3$ layer. The $Al_2O_3$ layer may denote a layer including $Al_2O_3$ as a main ingredient. The term "main ingredient" may denote an ingredient having the largest value of mass % in comparison to other ingredients.

The second layer 10 may include, sequentially from a side of the base 2, a first film 11, a second film 12 in contact with the first film 11, and a third film 13 in contact with the second film 12.

The first film 11, the second film 12 and the third film 13 may individually include Ti (titanium). The first film 11, the second film 12 and the third film 13 may also individually include at least one kind selected from C (carbon) and N (nitrogen).

More specifically, the first film 11, the second film 12 and the third film 13 may individually include a titanium compound. The first film 11, the second film 12 and the third film 13 may individually include the titanium compound as a main ingredient. Examples of the titanium compound may include carbides, nitrides, oxides, carbonitrides, carbonates and carboxynitrides of titanium.

The embodiments may satisfy a relationship of a first N content>a third N content>a second N content, in which the first N content is an n content in the first film 11, the second N content is an N content in the second film 12, and the third N content is an N content in the third film 13.

If satisfying the above relationship, the first film 11 is mostly likely to peel off among the first film 11, the second film 12 and the third film 13. In other words, the first film 11 has the lowest adhesion among the first film 11, the second film 12 and the third film 13. The first film 11 is most excellent in welding resistance among the first film 11, the second film 12 and the third film 13.

If satisfying the above relationship, the second film 12 has the highest hardness among the first film 11, the second film 12 and the third film 13. Meanwhile, the second film 12 has the lowest welding resistance among the first film 11, the second film 12 and the third film 13.

If satisfying the above relationship, the third film 13 has hardness, peeling resistance and welding resistance which are intermediate between those of the first film 11 and the second film 12.

The coated tool 1, in which the individual films thus configured have the above coating configuration, is excellent in wear resistance and welding resistance.

The first N content, the second N content and the third N content are not limited to a specific value. For example, the first N content may be set to 45-55 atom %. The second N content may be set to 0-25 atom %. The third N content may be set to 25-45 atom %. The N content may be a value measured by, for example, an energy dispersive X-ray spectroscopy (EDS) analysis method.

The first film 11 may include particles composed of $Ti(C_{x1}N_{y1}O_{z1})$ ($0 \leq x1 \leq 1$, $0 \leq y1 \leq 1$, $0 \leq z1 \leq 1$, $x1+y1+z1=1$). The second film 12 may include particles composed of $Ti(C_{x2}N_{y2}O_{z2})$ ($0 \leq x2 \leq 1$, $0 \leq y2 \leq 1$, $0 \leq z2 < 1$, $x2+y2+z2=1$). The third film 13 may include particles composed of $Ti(C_{x3}N_{y3}O_{z3})$ ($0 \leq x3 \leq 1$, $0 \leq y3 \leq 1$, $0 \leq z3 < 1$, $x3+y3+z3=1$).

It may be y1=1. That is, the first film 11 may include TiN particles. The first film 11 may be a TiN film. The TiN film may mean a film including TiN as a main ingredient. This may be also true for other films.

It may be x2=1. It may also be $0<x3<1$, $0<y3<1$, and z3=0. That is, the second film 12 may include TiC particles, and the third film 13 may include TiCN particles. The second film 12 may be a TiC film, and the third film 13 may be a TiCN film.

It may be $0<x2<1$, $0<y2<1$, and z2=0. It may also be $0<x3<1$, $0<y3<1$, and z3=0. That is, the second film 12 and the third film 13 may individually include TiCN particles. The second film 12 and the third film 13 may individually be a TiCN film.

In cases where the second film 12 and the third film 13 individually include TiCN particles, it may be X2>X3. That is, a C content in the second film 12 may be larger than a C content in the third film 13.

The third film 13 may include C and N. N/(C+N) in the third film 13 may be 0.7 or more. N/(C+N) in the third film 13 may be 0.9 or less. The N/(C+N) may be a content ratio of N in atomic ratio to a sum of C and N. The N/(C+N) may be measured by, for example, the energy dispersive X-ray spectroscopy (EDS) analysis method. The N/(C+N) represents an atomic ratio.

The first film 11, the second film 12 and the third film 13 may have the same or different thicknesses. For example, the second film 12 may have a larger thickness than each of the first film 11 and third film 13. This leads to enhanced wear resistance.

The thickness of each of the first film 11, the second film 12 and the third film 13 is not limited to a specific value. For example, the thickness of the first film 11 may be set to 0.1-0.5 μm. The thickness of the second film 12 may be set to 0.5-1.0 μm. The thickness of the third film 13 may be set to 0.3-0.7 μm. The thickness of the second film 12 may be 40% or more of an entire thickness of the second layer 10.

The thickness of the second layer 10 may be the same as or different from the thickness of the first layer 9. For example, the thickness of the second layer 10 may be larger than the thickness of the first layer 9.

The second layer 10 may or may not be in contact with the first layer 9. Similarly, the first layer 9 may or may not be in contact with the base 2. For example, the first coating layer 8 may include other layer located between the first layer 9 and the second layer 10, or other layer located between the base 2 and the first layer 9. The other layer may include TiN particles, TIC particles or TiCN particles. The other layer may be a TiN film, TiC film or TiCN film.

The first coating layer 8 may be located on the first surface 5 (rake surface). This leads to enhanced wear resistance and welding resistance of the first surface 5.

The first coating layer 8 may be located on the second surface 6 (flank surface). This leads to enhanced wear resistance and welding resistance of the second surface 6.

Figure 4:
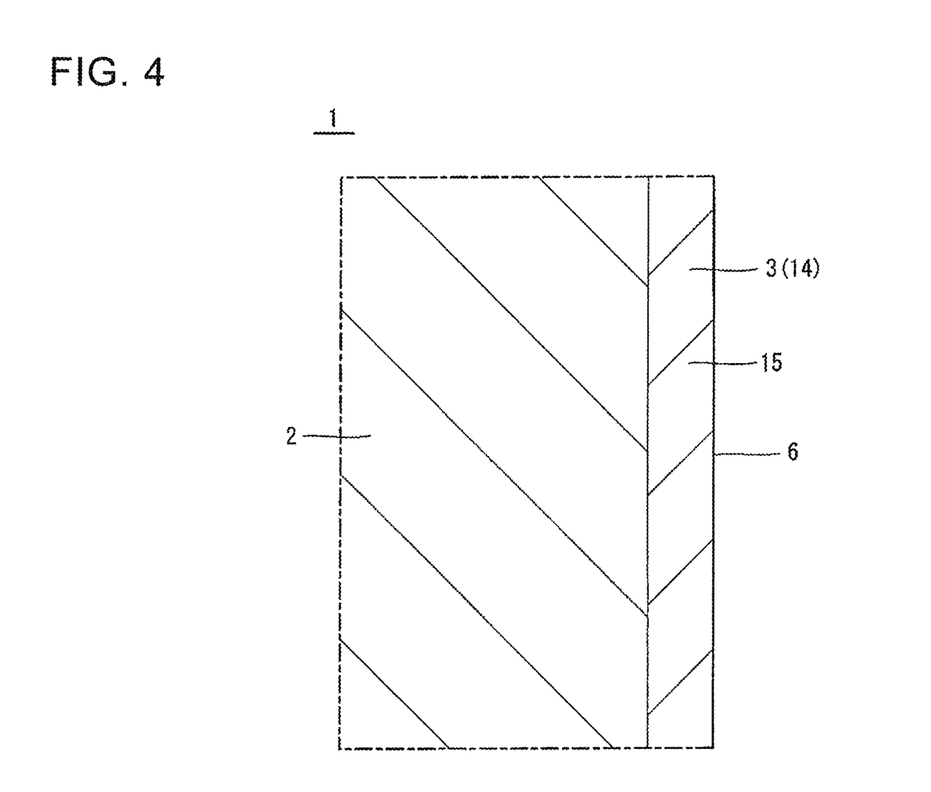
FIG. 4 is an enlarged view of a region A2 illustrated in FIG. 2.

The coating layer 3 may include a second coating layer 14 as in a non-limiting embodiment illustrated in FIG. 4. The second coating layer 14 may include a third layer 15. The third layer 15 may include $Al_2O_3$ particles. The third layer 15 may be an $Al_2O_3$ layer. The third layer 15 may be an outermost layer.

The second coating layer 14 may be located on the second surface 6 (flank surface). This leads to enhanced welding resistance of the second surface 6.

The second coating layer 14 may be located on the first surface 5 (rake surface). This leads to enhanced welding resistance of the first surface 5.

The first coating layer 8 may be located on the first surface 5 (rake surface), and the second coating layer 14 may be located on the second surface (flank surface). These lead to enhanced wear resistance and welding resistance of the first surface 5, and enhanced welding resistance of the second surface 6.

The first coating layer 8 may be located on the second surface 6 (flank surface), and the second coating layer 14 may be located on the first surface 5 (rake surface). These lead to enhanced welding resistance of the first surface 5, and enhanced wear resistance and welding resistance of the second surface 6.

<Method for Manufacturing Coated Tool>

A method for manufacturing a coated tool in a non-limiting embodiment of the present disclosure is described below by illustrating an embodiment of manufacturing the coated tool 1.

A base 2 may be firstly manufactured. A description is given by illustrating cases where the base 2 composed of a hard alloy is manufactured as the base 2. Firstly, a mixed powder may be prepared by suitably adding metal powder, carbon powder or the like to an inorganic powder of metal carbide, nitride, carbonitride, oxide or the like, with which it is possible to form the base 2 by sintering, and by mixing them together. A molded body may be obtained by molding the mixed powder into a predetermined tool shape with a known molding method, such as press molding, casting molding, extrusion molding or cold isostatic pressing. Subsequently, the base 2 may be obtained by sintering the obtained molded body in a vacuum or a non-oxidizing atmosphere. A surface 4 of the base 2 may be subjected to polishing process and honing process.

Subsequently, the coated tool 1 may be obtained by depositing a coating layer 3 on the surface 4 of the obtained base 2 by CVD method.

In cases where the first layer 9 is in contact with the base 2 as in the non-limiting embodiment illustrated in FIG. 3, a first layer 9 ($Al_2O_3$ layer) may be firstly deposited. First of all, a mixed gas may be prepared as a reaction gas composition. The mixed gas is composed of 0.5-5 vol % of aluminum trichloride ($AlCl_3$) gas, 0.5-3.5 vol % of hydrogen chloride (HCl) gas, 0.5-5 vol % of carbon dioxide ($CO_2$) gas, 0.5 vol % or less of hydrogen sulfide ($H_2S$) gas, and the rest, namely, hydrogen ($H_2$) gas. A first layer 9 may be deposited by loading the mixed gas into a chamber in which a set temperature is 930-1010° C., a set pressure is 5-10 kPa and a set time is 30-300 minutes. The above deposition conditions are applicable to a third layer 15.

Subsequently, a first film 11, a second film 12 and a third film 13 in a second layer 10 may be sequentially deposited.

The following description is given by illustrating cases where a TiN film is deposited as the first film 11. Firstly, a mixed gas may be prepared as a reaction gas composition. The mixed gas is composed of 0.1-10 vol % of titanium tetrachloride ($TiCl_4$) gas, 10-60 vol % of nitrogen ($N_2$) gas, and the rest, namely, hydrogen ($H_2$) gas. The first film 11 that is the TiN film may be deposited by loading the mixed gas into the chamber in which a set temperature is 800-1010° C., a set pressure is 10-85 kPa and a set time is 10-60 minutes.

The following description is given by illustrating cases where a TiC film is deposited as the second film 12. Firstly, a mixed gas may be prepared as a reaction gas composition. The mixed gas is composed of 0.1-30 vol % of titanium tetrachloride ($TiCl_4$) gas, 0.1-20 vol % of methane ($CH_4$) gas, and the rest, namely, hydrogen ($H_2$) gas. The second film 12 that is the TiC film may be deposited by loading the mixed gas into the chamber in which a set temperature is 800-1100° C., a set pressure is 10-85 kPa and a set time is 10-120 minutes.

The following description is given by illustrating cases where a TiCN film is deposited as the third film 13. Firstly, a mixed gas may be prepared as a reaction gas composition. The mixed gas is composed of 0.1-10 vol % of titanium tetrachloride ($TiCl_4$) gas, 10-60 vol % of nitrogen ($N_2$) gas, 0.1-15 vol % of methane ($CH_4$) gas, and the rest, namely, hydrogen ($H_2$) gas. The third film 13 that is the TiCN film may be deposited by loading the mixed gas into the chamber in which a set temperature is 800-1100° C., a set pressure is 5-30 kPa and a set time is 20-100 minutes. The above deposition conditions are applicable to cases where the second film 12 is a TiCN film. For example, a large proportion of $N_2$ ingredient in the above reaction gas composition leads to a large N/(C+N), whereas a small proportion of $N_2$ ingredient leads to a small N/(C+N).

N contents in the first film 11, the second film 12 and the third film 13 can be controlled as follows: the first N content>the third N content>the second N content by controlling the reaction gas compositions when depositing the first film 11, the second film 12 and the third film 13.

A region including the cutting edge 7 in the coated tool 1 thus obtained may be subjected to a polishing process. Consequently, the region including the cutting edge 7 can be made smooth, so that welding of a workpiece can be reduced to improve fracture resistance of the cutting edge 7.

The above manufacturing method is an embodiment of methods for manufacturing the coated tool 1. Accordingly, it should be noted that the coated tool 1 is not limited to ones which are manufactured by the above manufacturing method.

<Cutting Tool>

Figure 5:
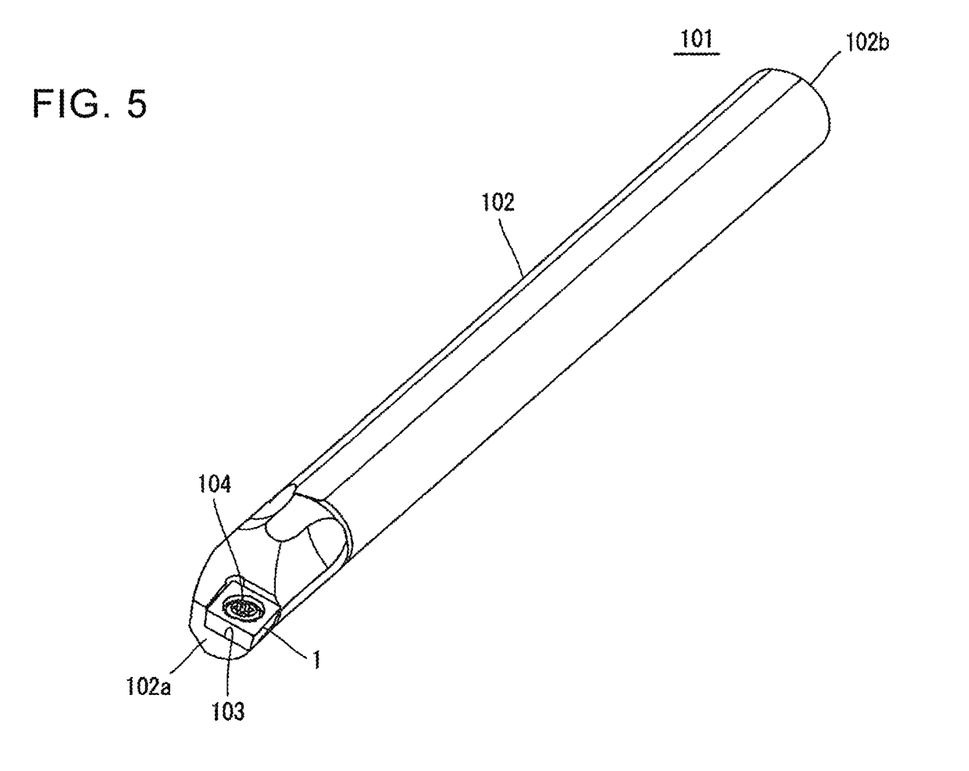
FIG. 5 is a perspective view illustrating a cutting tool in a non-limiting embodiment of the present disclosure.

As in a non-limiting embodiment illustrated in FIG. 5, a cutting tool 101 in the non-limiting embodiment of the present disclosure may include a holder 102 having a length from a first end 102a to a second end 102b and including a pocket 103 located on a side of the first end 102a, and a coated tool 1 located in the pocket 103. FIG. 5 illustrates the embodiment where the coated tool 1 includes a through hole and the coated tool 1 is secured through the through hole to the pocket 103 with a screw 104.

The present disclosure is described in detail below by illustrating examples, however, the present disclosure is not limited to the following examples.

Examples

[Samples Nos. 1 to 8]

<Coated Tool Manufacturing>

Firstly, a base was manufactured. Specifically, 6 mass % of metal Co powder having a mean particle diameter of 1.5 μm, 2.0 mass % of TiC (titanium carbide) powder, 0.2 mass % of $Cr_3C_2$ (chromium carbide) powder were added in their respective proportions to WC powder having a mean particle diameter of 1.2 μm, and these were mixed together. A molded body was obtained by molding a mixture thus obtained into a cutting tool shape (CNMG120408) by press molding. The obtained molded body was then subjected to debinding process, followed by sintering at 1400° C. in a vacuum of 0.5-100 Pa for one hour, thereby manufacturing a base composed of cemented carbide. Thereafter, a side of a rake surface (first surface) of the manufactured base was subjected to cutting edge processing (round honing) by brushing process.

Subsequently, a coating layer (second layer) was deposited on the obtained base by CVD method under deposition conditions presented in Table 1, thereby obtaining a coated tool (cutting insert) presented in Table 2.

All the coated tools presented in Table 2 include the $Al_2O_3$ layer (first layer) deposited on the base. Deposition conditions and a thickness of the $Al_2O_3$ layer are as follows.

$AlCl_3$ gas: 4.0 vol %
HCl gas: 1.0 vol %
$CO_2$ gas: 4.5 vol %
$H_2S$ gas: 0.3 vol %
$H_2$ gas: the rest
Temperature: 1000° C.
Pressure: 10 kPa
Time: 300 minutes
Thickness: 5.0 μm Individual compounds are respectively indicated by chemical symbols in Tables 1 and 2. Thicknesses of the coating films presented in Table 1 and the thickness of the $Al_2O_3$ layer are values obtained by a cross-section observation using an SEM. In Table 1, a film represented as TiN does not substantially include C, and N/(C+N) is approximately 1. A film represented as TiC does not substantially include N, and N/(C+N) is approximately zero. Additionally, in Table 1, N/(C+N) of the TiCN film in Sample No. 1 is 0.8, N/(C+N) of the TiCN film in each of Samples Nos. 2 to 7 is 0.7, and N/(C+N) of the TiCN film in Sample No. 8 is 0.5.

<Evaluation>

An appearance color of each of the obtained coated tools was evaluated visually. Results thereof are shown in Table 1. Wear resistance and the presence and absence of welding to the cutting edge were evaluated. A measuring method is described below, and results thereof are shown in Table 2.

<Cutting Evaluation Conditions>

Wear Resistance Evaluation
Machining method: Turning process
Workpiece: SCM435 round rod
Cutting speed: 300 m/min
Feed rate: 0.3 mm/rev
Depth of Cut: 1.5 mm
Machining state: Wet
Evaluation item: Determination of a wear amount of the flank surface after cutting out for 20 minutes Welding Resistance Evaluation
Machining method: Turning process
Workpiece: S45C round rod
Cutting speed: 100 m/min
Feed rate: 0.1 mm/rev
Depth of Cut: 1.0 mm
Machining state: Wet
Evaluation item: Determination of a state of welding to the cutting edge after cutting out for five minutes Table 2 shows individual amounts of flank wear (Vb) after cutting out for 20 minutes, and individual states of welding to the cutting edge after cutting out for five minutes. In a column of cutting edge welding in Table 2, two parameters of cutting edge welding and chipping are represented by the following evaluation criteria. Regarding the state of welding to the cutting edge, an evaluation result "excellent" means that neither welding nor chipping occurred, an evaluation result "good" means that slight welding was observed though no chipping occurred, an evaluation result "average" means that a larger amount of welding occurred than that in the criterion "good" though no chipping occurred, and an evaluation result "poor" means that welding occurred and chipping due to the welding occurred.

TABLE 1

| Sample No. | Second layer | Raw material gas composition (% by volume) | | | | Temperature (° C.) | Pressure (kPa) | Time (minutes) | Film configuration | N/(C+N) | Film thickness (μm) | Total film thickness of first, second and third films | Appearance color |
|---|---|---|---|---|---|---|---|---|---|---|---|---|---|
| | | $TiCl_4$ | $N_2$ | $CH_4$ | $H_2$ | | | | | | | | |
| 1 | First film | 2.0 | 20.0 | 3.5 | Rest | 980 | 20 | 20 | TiCN | 0.8 | 0.2 | 0.7 | Yellow |
| | Second film | 2.0 | — | 5.0 | Rest | 1000 | 30 | 45 | TiC | 0 | 0.2 | | |
| | Third film | 2.0 | 30.0 | — | Rest | 1000 | 20 | 30 | TiN | 1 | 0.3 | | |
| 2 | First film | 1.0 | 14.0 | — | Rest | 1000 | 30 | 45 | TiN | 1 | 0.4 | 1.5 | Silver |
| | Second film | 1.5 | 10.5 | 1.5 | Rest | 1000 | 30 | 30 | TiCN | 0.7 | 0.4 | | |
| | Third film | 2.0 | — | 5.0 | Rest | 1000 | 30 | 45 | TiC | 0 | 0.7 | | |
| 3 | First film | 1.0 | 14.0 | — | Rest | 1000 | 30 | 45 | TiN | 1 | 0.4 | 1.2 | Pink |
| | Second film | 2.0 | — | 5.0 | Rest | 1000 | 30 | 20 | TiC | 0 | 0.4 | | |
| | Third film | 1.5 | 10.5 | 1.5 | Rest | 1000 | 30 | 30 | TiCN | 0.7 | 0.4 | | |
| 4 | First film | 1.0 | 14.0 | — | Rest | 1000 | 30 | 45 | TiN | 1 | 0.4 | 1.3 | Pink |
| | Second film | 2.0 | — | 5.0 | Rest | 1000 | 30 | 30 | TiC | 0 | 0.5 | | |
| | Third film | 1.5 | 10.5 | 1.5 | Rest | 1000 | 30 | 30 | TiCN | 0.7 | 0.4 | | |
| 5 | First film | 1.0 | 14.0 | — | Rest | 1000 | 30 | 45 | TiN | 1 | 0.4 | 1.5 | Pink |
| | Second film | 2.0 | — | 5.0 | Rest | 1000 | 30 | 45 | TiC | 0 | 0.7 | | |
| | Third film | 1.5 | 10.5 | 1.5 | Rest | 1000 | 30 | 30 | TiCN | 0.7 | 0.4 | | |
| 6 | First film | 1.0 | 14.0 | — | Rest | 1000 | 30 | 45 | TiN | 1 | 0.4 | 1.8 | Pink |
| | Second film | 2.0 | — | 5.0 | Rest | 1000 | 30 | 60 | TiC | 0 | 1.0 | | |
| | Third film | 1.5 | 10.5 | 1.5 | Rest | 1000 | 30 | 30 | TiCN | 0.7 | 0.4 | | |
| 7 | First film | 1.0 | 14.0 | — | Rest | 1000 | 30 | 45 | TiN | 1 | 0.4 | 2 | Pink |
| | Second film | 2.0 | — | 5.0 | Rest | 1000 | 30 | 80 | TiC | 0 | 1.2 | | |
| | Third film | 1.5 | 10.5 | 1.5 | Rest | 1000 | 30 | 30 | TiCN | 0.7 | 0.4 | | |
| 8 | First film | 1.0 | 14.0 | — | Rest | 1000 | 30 | 45 | TiN | 1 | 0.4 | 1.5 | Black |
| | Second film | 2.0 | — | 5.0 | Rest | 1000 | 30 | 45 | TiC | 0 | 0.7 | | |
| | Third film | 1.5 | 7.0 | 1.5 | Rest | 1000 | 30 | 30 | TiCN | 0.5 | 0.4 | | |

TABLE 2

| Sample No. | Amounts of flank wear Vb(mm) | Cutting edge welding |
|---|---|---|
| 1 | 0.15 | Excellent |
| 2 | 0.08 | Poor |
| 3 | 0.10 | Excellent |
| 4 | 0.09 | Excellent |
| 5 | 0.08 | Excellent |
| 6 | 0.07 | Excellent |
| 7 | 0.05 | Good |
| 8 | 0.08 | Average |

As shown in Table 2, Samples Nos. 3 to 8 respectively corresponding to examples offered better cutting performance than Samples Nos. 1 to 2 respectively corresponding to comparative examples.

DESCRIPTION OF THE REFERENCE NUMERAL 1 coated tool (cutting insert)
2 base
3 coating film
4 surface
5 first surface
6 second surface
7 cutting edge
8 first coating layer
9 first layer
10 second layer
11 first film
12 second film
13 third film
14 second coating layer
15 third layer
101 cutting tool
102 holder
102a first end
102b second end
103 pocket
104 screw

The invention claimed is:

1. A coated tool, comprising a base and a coating layer located on the base, the coated tool comprising a first surface, a second surface adjacent to the first surface, and a cutting edge located on at least a part of a ridge part of the first surface and the second surface, wherein
the coating layer comprises a first coating layer comprising
a first layer comprising $Al_2O_3$ particles, and
a second layer located on the first layer,
the second layer comprises, sequentially from a side of the base,
a first film,
a second film in contact with the first film, and
a third film in contact with the second film,
the first film, the second film and the third film individually comprise Ti,
the first film, the second film and the third film individually comprise at least one kind selected from C and N,
the coated tool satisfies a relationship of a first N content>a third N content>a second N content, in which the first N content is an N content in the first film, the second N content is an N content in the second film, and the third N content is an N content in the third film,
the third film comprises C and N, and
$N/(C+N)$ in the third film is 0.7 or more.

2. The coated tool according to claim 1, wherein a thickness of the second film is larger than each of a thickness of the first film and a thickness of the third film.

3. The coated tool according to claim 1, wherein a thickness of the second film is 0.5-1.0 μm.

4. A cutting tool, comprising:
a holder which has a length from a first end to a second end and comprises a pocket located on a side of the first end; and
a coated tool, the coated tool being located in the pocket, wherein
the coated tool comprises a base and a coating layer located on the base,
the coated tool comprises a first surface, a second surface adjacent to the first surface, and a cutting edge located on at least a part of a ridge part of the first surface and the second surface,
the coating layer comprises a first coating layer comprising
a first layer comprising $Al_2O_3$ particles, and
a second layer located on the first layer,
the second layer comprises, sequentially from a side of the base,
a first film,
a second film in contact with the first film, and
a third film in contact with the second film,
the first film, the second film and the third film individually comprise Ti,
the first film, the second film and the third film individually comprise at least one kind selected from C and N,
the coated tool satisfies a relationship of a first N content>a third N content>a second N content, in which the first N content is an N content in the first film, the second N content is an N content in the second film, and the third N content is an N content in the third film,
the third film comprises C and N, and
$N/(C+N)$ in the third film is 0.7 or more.

* * * * *